United States Patent
Talbot et al.

(10) Patent No.: US 8,570,881 B2
(45) Date of Patent: Oct. 29, 2013

(54) TRANSMITTER VOLTAGE AND RECEIVER TIME MARGINING

(75) Inventors: Gerald R. Talbot, Concord, MA (US);
Paul C. Miranda, Austin, TX (US);
Emerson S. Fang, Fremont, CA (US);
Rohit Kumar, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1952 days.

(21) Appl. No.: 11/668,010

(22) Filed: Jan. 29, 2007

(65) Prior Publication Data

US 2007/0230513 A1    Oct. 4, 2007

Related U.S. Application Data

(60) Provisional application No. 60/786,546, filed on Mar. 28, 2006.

(51) Int. Cl.
| | | |
|---|---|---|
| *G01R 31/28* | (2006.01) | |
| *G01R 31/30* | (2006.01) | |
| *G01R 31/08* | (2006.01) | |
| *H04J 1/16* | (2006.01) | |
| *H04J 3/14* | (2006.01) | |
| *G01R 31/316* | (2006.01) | |
| *G01R 31/317* | (2006.01) | |
| *H04L 1/20* | (2006.01) | |

(52) U.S. Cl.
CPC ............ *G01R 31/30* (2013.01); *G01R 31/3004* (2013.01); *G01R 31/316* (2013.01); *G01R 31/317* (2013.01); *H04L 1/20* (2013.01)
USPC ............ 370/252; 370/516; 714/724; 714/745

(58) Field of Classification Search
CPC ...... H04L 1/20; G01R 31/30; G01R 31/3004; G01R 31/317; G01R 31/316
USPC ........... 370/252; 375/315, 355, 516; 714/724, 714/745
See application file for complete search history.

(56) References Cited

U.S. PATENT DOCUMENTS

| | | |
|---|---|---|
| 5,285,122 A | 2/1994 | Honda et al. |
| 5,465,065 A | 11/1995 | Stevens |

(Continued)

FOREIGN PATENT DOCUMENTS

EP    1601130 A2    11/2005

OTHER PUBLICATIONS

Garlepp, Bruno W., et al., "A Portable Digital DLL for High-Speed CMOS Interface Circuits," IEEE Journal of Solid-State Circuits, vol. 34, No. 5, May 1999, pp. 632-644.

(Continued)

*Primary Examiner* — Ayaz Sheikh
*Assistant Examiner* — Tarell Hampton
(74) *Attorney, Agent, or Firm* — Abel Law Group, LLP

(57) ABSTRACT

A technique for characterizing a communications interface includes determining a voltage margin and a timing margin of the interface based on data sampled by a sampling device of a receiver of the interface. In at least one embodiment of the invention, a method for determining margin associated with a receiver circuit of an integrated circuit includes periodically sampling a signal over a time period by a receiver sampling circuit of the receiver circuit to generate a sampled version of the signal. The method includes incrementally varying a value of the parameter associated with the signal. The varying of the parameter is through a range of values of the parameter over the time period. The method includes determining a margin value of the receiver circuit associated with the parameter based, at least in part, on the sampled version of the signal.

18 Claims, 9 Drawing Sheets

(56) References Cited

U.S. PATENT DOCUMENTS

| | | |
|---|---|---|
| 5,652,530 A | 7/1997 | Ashuri |
| 5,742,798 A | 4/1998 | Goldrian |
| 5,923,715 A | 7/1999 | Ono |
| 6,300,802 B1 | 10/2001 | Smetana |
| 6,337,590 B1 | 1/2002 | Millar |
| 6,433,579 B1 | 8/2002 | Wang et al. |
| 6,437,599 B1 | 8/2002 | Groen |
| 6,445,223 B1 | 9/2002 | Thilenius |
| 6,493,409 B1 | 12/2002 | Lin et al. |
| 6,496,048 B1 | 12/2002 | Sikkink |
| 6,504,397 B1 | 1/2003 | Hart et al. |
| 6,633,190 B1 | 10/2003 | Alvandpour et al. |
| 6,664,814 B1 | 12/2003 | Evans et al. |
| 6,665,347 B2 | 12/2003 | van Bavel et al. |
| 6,670,835 B2 | 12/2003 | Yoo |
| 6,919,742 B1 | 7/2005 | McGlinchey |
| 6,920,540 B2 | 7/2005 | Hampel et al. |
| 6,940,302 B1 | 9/2005 | Shumarayev et al. |
| 6,959,062 B1 | 10/2005 | Stubbs |
| 7,109,767 B1 | 9/2006 | Amick et al. |
| 7,126,429 B2 | 10/2006 | Mitric |
| 7,145,359 B2 | 12/2006 | Hein et al. |
| 7,256,636 B2 | 8/2007 | Kumar et al. |
| 7,271,634 B1 | 9/2007 | Daga et al. |
| 7,317,769 B2 | 1/2008 | Tonietto et al. |
| 7,425,858 B1 | 9/2008 | Daga |
| 7,483,688 B2 | 1/2009 | Huang et al. |
| 7,492,816 B1 | 2/2009 | Wong et al. |
| 7,643,563 B2 | 1/2010 | Huang et al. |
| 2003/0002607 A1 | 1/2003 | Mooney et al. |
| 2003/0128767 A1 | 7/2003 | Kudoh |
| 2003/0152181 A1 | 8/2003 | Stengel et al. |
| 2003/0199262 A1 | 10/2003 | Chung |
| 2003/0226053 A1 | 12/2003 | Khieu et al. |
| 2004/0046589 A1 | 3/2004 | Gauthier et al. |
| 2004/0047409 A1 | 3/2004 | Lee et al. |
| 2004/0125905 A1 | 7/2004 | Vlasenko et al. |
| 2004/0177301 A1* | 9/2004 | Tarango et al. ............... 714/738 |
| 2004/0193972 A1* | 9/2004 | Mitlin et al. ................... 714/704 |
| 2004/0202266 A1 | 10/2004 | Gregorius et al. |
| 2005/0089126 A1 | 4/2005 | Zerbe et al. |
| 2005/0259774 A1* | 11/2005 | Garlepp ........................ 375/355 |
| 2006/0188043 A1* | 8/2006 | Zerbe et al. ................... 375/346 |
| 2007/0071153 A1* | 3/2007 | Eglit ............................. 375/355 |
| 2007/0075757 A1 | 4/2007 | Kumar et al. |
| 2007/0075776 A1 | 4/2007 | Garlapati et al. |
| 2007/0094428 A1* | 4/2007 | Lau ............................... 710/104 |
| 2007/0182615 A1 | 8/2007 | Aliahmad et al. |
| 2007/0185668 A1* | 8/2007 | Moll .............................. 702/69 |
| 2007/0230553 A1 | 10/2007 | Talbot et al. |
| 2007/0230646 A1 | 10/2007 | Talbot et al. |
| 2008/0034378 A1 | 2/2008 | Kumar et al. |
| 2008/0056426 A1 | 3/2008 | Si et al. |
| 2008/0295603 A1 | 12/2008 | Shin et al. |

OTHER PUBLICATIONS

Maneatis, John G., "Low-Jitter Process-Independent DLL and PLL Based on Self-Biased Techniques," IEEE Journal of Solid-State Circuits, vol. 31, No. 11, Nov. 1996, pp. 1723-1732.

Sidiropoulos, Stafanos and Horowitz, Mark A., "A Semidigital Dual Delay-Locked Loop," IEEE Journal of Solid-State Circuits, vol. 32, No. 11, Nov. 1997, pp. 1683-1692.

Ng, Hiok-Tiaq, et al., "A Second-Order Semidigital Clock Recovery Circuit Based on Injection Locking," IEEE Journal of Solid-State Circuits, IEEE Service Center, Piscataway, NJ, US, vol. 38, No. 12, Dec. 2003, pp. 2101-2110.

Rambus "Phase Interpolator Based CDR," from URL: http://www.rambus.com/products/innovationslicensing/innovations/interp_cdr.aspx, retrieved Apr. 13, 2006, 6 pages.

* cited by examiner

TRANSMITTER VOLTAGE AND RECEIVER TIME MARGINING

CROSS-REFERENCE TO RELATED APPLICATION(S)

This application claims benefit under 35 U.S.C. §119 of provisional application No. 60/786,546, filed Mar. 28, 2006, entitled "Method and Apparatus for Link Operations," naming Gerry R. Talbot, Paul Miranda, Mark D. Hummel, William A. Hughes, and Larry D. Hewitt as inventors, which application is incorporated by reference herein.

BACKGROUND

1. Field of the Invention

This application is related to integrated circuits and more particularly to data communications links between integrated circuits.

2. Description of the Related Art

System level characterization at pins of an integrated circuit in a data communications system operating at high frequency rates (e.g., 1.0 GHz or greater) may be difficult to measure and may not provide useful information with respect to signal characteristics at the integrated circuit pad. Therefore, it is difficult to quantify the operating margin of a particular data communications system. Probing signals at the integrated circuit pad may be impracticable in some systems and in other systems may not provide information regarding the response of an input amplifier to complex voltage waveforms delivered by a channel. Although it may be possible to measure global voltage margin and global frequency margin of the system, such techniques do not provide direct information about electrical parameters of a specific communications link, e.g., time margin at the receiver of a sampling device. Accordingly, improved techniques for characterizing and testing a communications link are desired.

SUMMARY

A technique for characterizing a communications interface includes determining a voltage margin and a timing margin of the interface based on data sampled by a sampling device of a receiver of the interface. In at least one embodiment of the invention, a method for determining margin associated with a receiver circuit of an integrated circuit includes periodically sampling a signal over a time period by a receiver sampling circuit of the receiver circuit to generate a sampled version of the signal. The method includes incrementally varying a value of the parameter associated with the signal. The varying of the parameter is through a range of values of the parameter over the time period. The method includes determining a margin value of the receiver circuit associated with the parameter based, at least in part, on the sampled version of the signal.

In at least one embodiment of the invention, an apparatus includes an integrated circuit including a transmitter circuit configured to transmit a first signal over a first communications path. The integrated circuit includes a receiver circuit configured to receive a second signal over a second communications path. At least one of the transmitter circuit and the receiver circuit is configured to incrementally vary a phase alignment of a sample clock signal used by the receiver circuit to sample the second signal, the varying of the phase alignment being through a range of values of the phase alignment over a time period.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
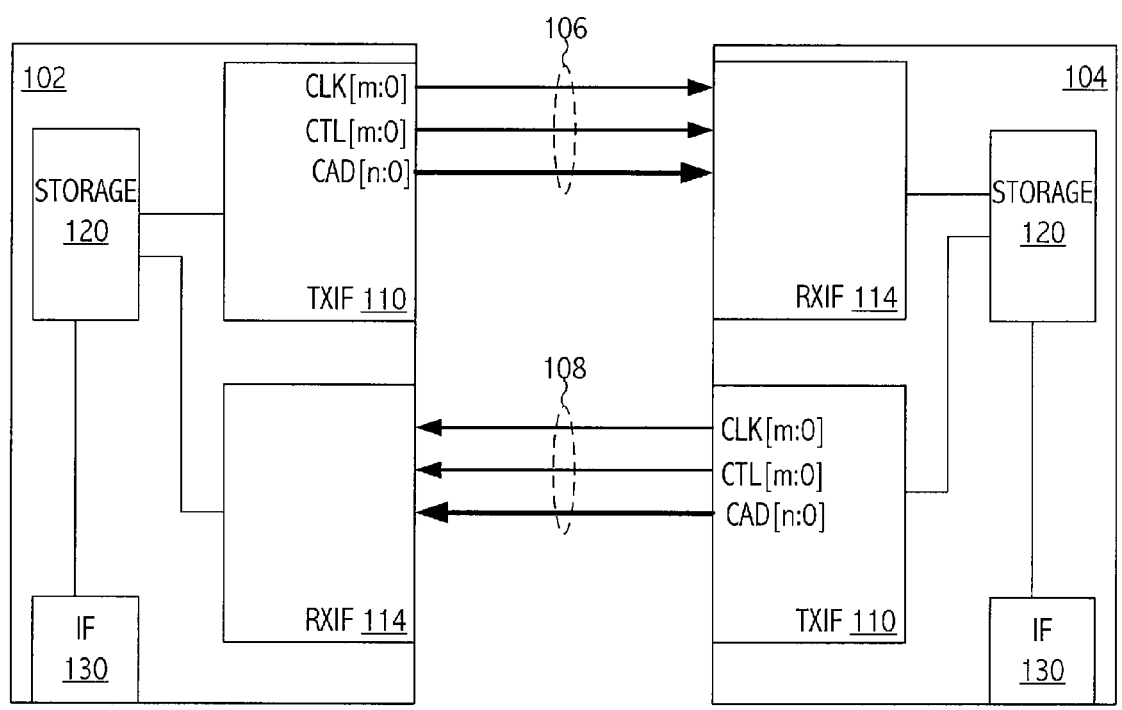
FIG. 1 illustrates a block diagram of two integrated circuit devices coupled by a communications link consistent with one or more embodiments of the present invention.

Referring to FIG. 1, integrated circuit 102 communicates with integrated circuit 104 by an exemplary communications link including transmit interfaces 110, receive interfaces 114, and communications paths 106 and 108, which include respective, individual communications paths for clock signals (e.g., CLK[m:0]), control signals (e.g., CTL[m:0]), and data signals (e.g., n-bits of commands, addresses, or data, i.e., CAD[n:0]). Those individual communications paths may be single-ended or differential communications paths. In at least one embodiment of the communications link, a bit-time is half a clock period in duration, i.e., two data bits (e.g., two CAD[n:0] bits or two CTL[m:0] bits) are transmitted on a corresponding communications path per clock cycle (e.g., a period of a respective one of CLK[m:0]). However, the teachings herein may be adapted for bit-times having one clock period in duration (i.e., one data bit is transmitted on a corresponding communications path per clock cycle) or for other suitable bit-time durations. Communications paths 106 and 108 are unidirectional, i.e., communications paths 106 provides paths from integrated circuit 102 to integrated circuit 104 and communications paths 108 provides paths to integrated circuit 102 from integrated circuit 104. Integrated circuit 102 includes a sideband control mechanism (e.g., interface 130) that provides access to control and/or status registers internal to integrated circuit 102 (e.g., locations in storage circuit 120). Interface 130 may be a Joint Test Action Group (i.e., JTAG) interface, System Management Bus (i.e., SMBus) interface, or other suitable interface. In at least one embodiment, interface 130 communicates test, characterization, and/or diagnostic information between the corresponding integrated circuit and an external processing device (not shown).

The communications link of FIG. 1 may be characterized by system level measurements including global frequency margining and global voltage margining of the communications link. As referred to herein, "margining" is a technique for determining a maximum amount of signal distortion that can be tolerated by a system without affecting interpretation of the signal by a decision circuit in the system. In general, margining with respect to a particular parameter includes evaluating performance of the system (e.g., determining a BER associated with the system) as the particular parameter is varied from a nominal setting, or other particular setting, over a period of time during which known data (e.g., pseudorandom data or other repeatable data patterns) is communicated over the link. Global frequency margining includes incrementally changing the operating frequency of the communications link over a particular range of operating frequencies and capturing data associated with data communications for each setting of the operating frequency. Global voltage margining includes incrementally changing the power supply voltage of the communications link over a particular range of power supply voltages and capturing data associated with data communications for each setting of the power supply voltage. The known data may be generated by built-in self test circuitry, external test equipment coupled to the communications link, or by other suitable techniques. Data acquired during global frequency margining and global voltage margining of the communications link may provide some information regarding system performance. However, those data generally do not provide information regarding electrical parameters of a specific link, in particular, the voltage and timing margin at the sampling device of the receiver interface.

In general, voltage margin and timing margin of the sampling device of a receive interface are indicators of the ability of the receive interface to properly recover data received by an integrated circuit node transmitted across a data communications link by another integrated circuit node. In particular, voltage margin and timing margin of the receive interface are indicators of the ability of the receive interface to sample the data during an appropriate phase of the data signal and to distinguish between voltages corresponding to high and low logic levels, respectively. Accordingly, techniques for performing timing margining and voltage margining at the sampling device of the receiver interface provide additional information that is useful in characterizing a communications link and estimating a corresponding system level BER.

Figure 2:
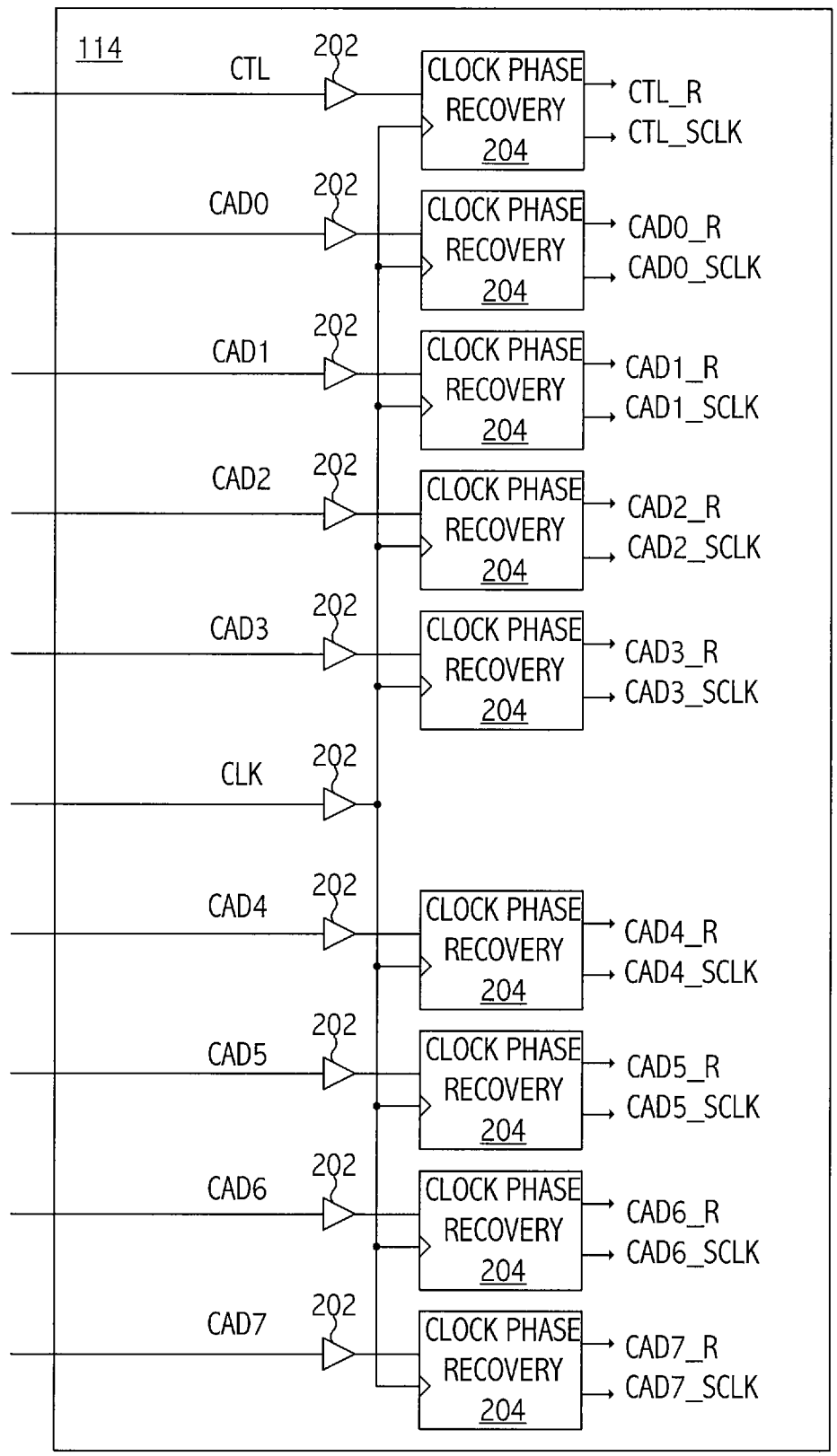
FIG. 2 illustrates a block diagram of a portion of a communications link receive path on an integrated circuit device consistent with one or more embodiments of the present invention.

Referring to FIG. 2, exemplary signals on individual communications paths, CLK, CTL, and CAD[7:0] in integrated circuit 104 are received by individual receivers 202 and individual clock phase recovery circuits 204 in receive interface 114. During data communications operations, receivers 202 may perform signal equalization, signal level shifting, noise reduction, or other appropriate signal processing functions. Exemplary clock phase recovery circuits 204 individually receive a received clock signal (e.g., CLK) in addition to a respective, received data signal (e.g., CTL, CAD0, CAD1, . . . , CAD7). Clock phase recovery circuits 204 generate corresponding sample clocks (e.g., CTL_SCLK, CAD0_SCLK, CAD1_SCLK, . . . , CAD7_SCLK) and provide the recovered data (e.g., CTL_R, CAD1_R, CAD2_R, . . . CAD7_R) to other circuitry of receive interface 114. An individual sample clock signal (e.g., CAD4_SCLK) is a dynamically delayed version of the received clock signal (e.g., CLK), which is dynamically delayed based at least in part on a phase difference between the received clock signal and the corresponding received data signal (e.g., CAD4).

In at least one embodiment, individual ones of clock phase recovery circuits 204 generate a sample clock signal for sampling the received data signal at the center of a data eye of the received data signal. The phase difference between the received clock signal and the received data signal may be nonstationary, i.e., this phase difference varies during a period of communications link operation. Thus, the delay applied to the received clock signal to generate the sample clock signal is adjusted during the period of communications link operation, accordingly. In at least one embodiment of clock phase recovery circuits 204, the phase difference between the received clock signal and the received data signal at the receiver is less than a particular transport phase difference threshold value (e.g., 3 unit intervals or bit-times). However, the phase difference between the sample clock signal and the received data signal may be greater than that particular transport phase difference threshold value.

Figure 3:
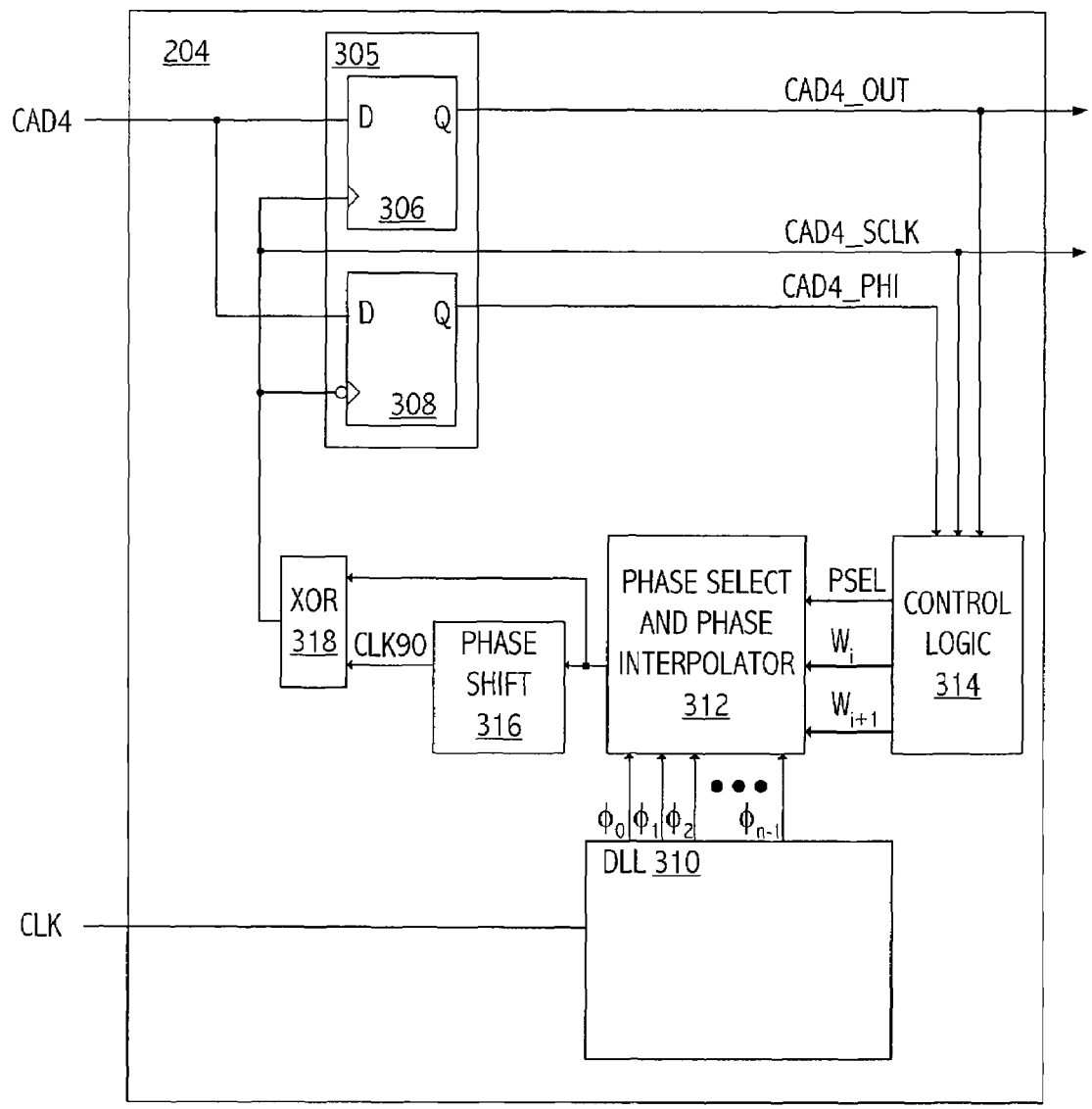
FIG. 3 illustrates a block diagram of an exemplary clock phase recovery circuit consistent with one or more embodiments of the present invention.

An exemplary clock phase recovery circuit (e.g., clock phase recovery circuit 204), consistent with at least one embodiment of the invention, is illustrated in FIG. 3. Clock phase recovery circuit 204 recovers phase information from the received data signal (e.g., CAD4) and the received clock signal (e.g., CLK) to generate a sample clock signal (e.g., CAD4_SCLK) and a sampled data signal (CAD4_OUT). Phase detector 305 includes two flip-flops (e.g., flip-flop 306 and flip-flop 308) that sample the received data signal based on the sample clock signal (e.g., CAD4_SCLK) 180° out of phase with each other. Phase detector 305 provides two signals, a sampled received data signal and a signal providing phase information, e.g., CAD4_OUT and CAD4_PHI, respectively. Those signals are indicative of the phase difference between the received data signal and the received clock signal and are provided to control logic 314.

Figure 6:
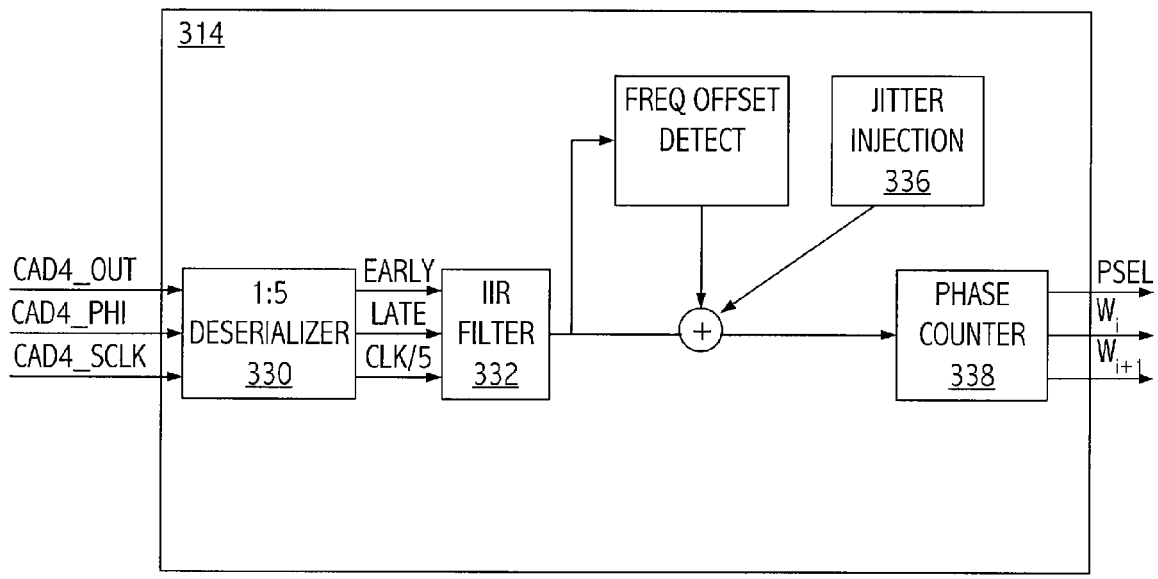
FIG. 6 illustrates a block diagram of an exemplary control logic circuit of a clock phase recovery circuit of FIG. 3 consistent with one or more embodiments of the present invention.

During data communications operations, control logic circuit 314 generates digital control signals (e.g., PSEL, $W_i$, and $W_{i+1}$) for adjusting the sample clock signal based on a comparison of CAD4_OUT to CAD4_PHI. Control logic circuit 314 controls a phase selection and phase interpolation circuit, (e.g., phase select and phase interpolator circuit 312) to generate the sample clock signal based at least in part on the received clock signal to generate the sample clock signal having a target phase relationship to the received data signal. For example, control logic circuit 314 may generate control signals PSEL, $W_i$, and $W_{i+1}$ to apply an appropriate delay to the received clock signal to generate the sample clock signal to sample the received data signal in substantially the center of the data eye. Referring to FIG. 6, in an exemplary control logic circuit 314, deserializer circuit 330 determines whether the phase of the sample clock signal is early or late with respect to the received data signal and a phase change request (e.g., phase counter 338 provides appropriate values of PSEL, $W_i$, and $W_{i+1}$) based on this determination. The phase change request applies a delay to shift the phase of the sample clock signal in a direction that aligns the sample clock signal with an appropriate phase of the data. Note that the relationship between phase ($\phi$, in degrees) and delay ($t_D$, in seconds) is $\phi = 360 \times t_D \times f$ (where frequency, f, is measured in Hz). In at least one embodiment of control logic 314, digital circuitry included in control logic 314 is responsive to a clock derived from the sample clock signal (e.g., CLK/5 generated by deserializer circuit 330). However, other clock signals of suitable frequency may be used by control logic 314.

Figure 4:
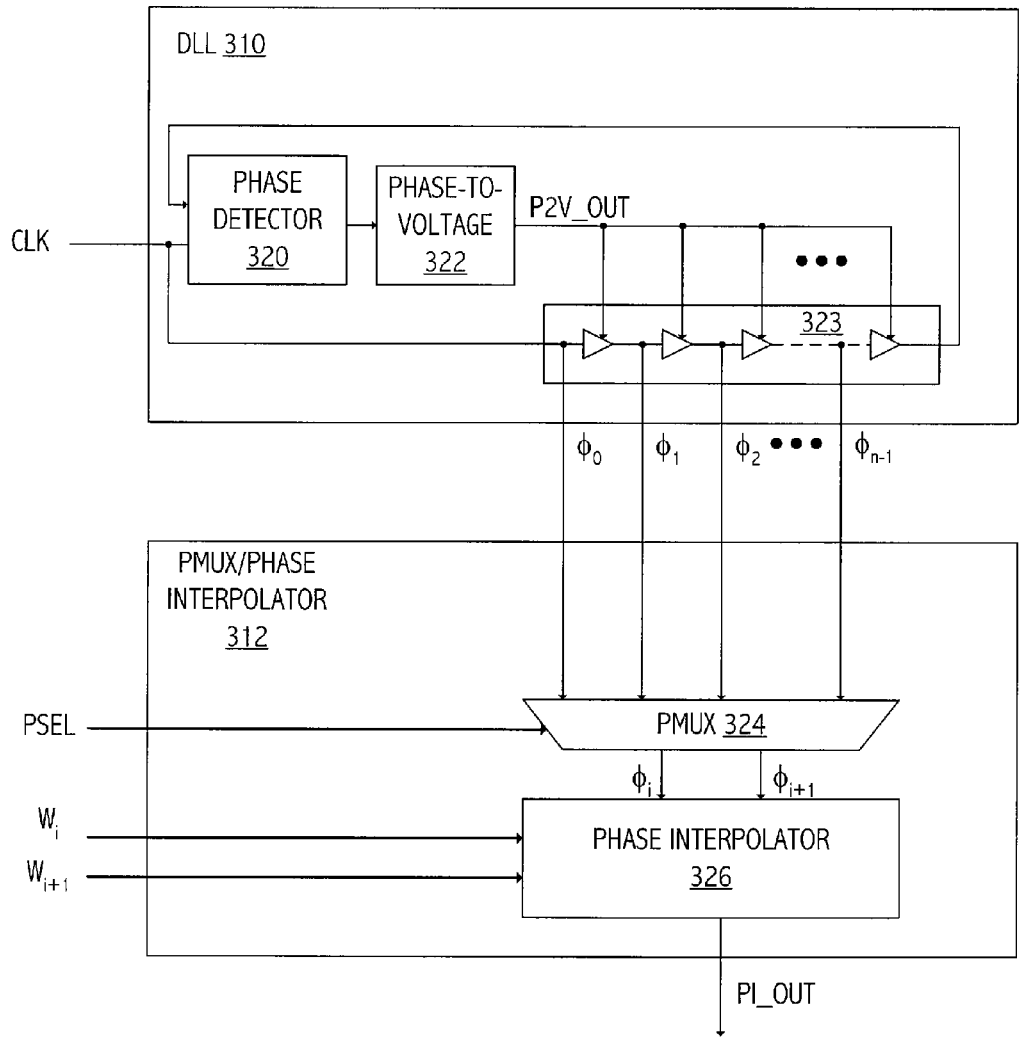
FIG. 4 illustrates a block diagram of an exemplary portion of the clock phase recovery circuit of FIG. 3 consistent with one or more embodiments of the present invention.

Referring back to FIG. 3, in addition to receiving control signals from control logic circuit 314, phase select and phase interpolation circuit 312 receives n phase signals from delay-locked loop (DLL) 310 (e.g., $\phi_0, \phi_1, \ldots, \phi_{n-1}$), which generates these signals based on the received clock signal. Referring to FIG. 4, in at least one embodiment of clock phase recovery circuit 204, DLL 310 includes a delay line (e.g., delay line 323) that is configured to have a total delay equal to the period of the received clock signal. Phase signals $\phi_0, \phi_1, \ldots, \phi_{n-1}$ are spaced evenly to cover the 360° phase space of the received clock signal. Phase signals $\phi_0, \phi_1, \ldots, \phi_{n-1}$ may include n/2 true phase signals (e.g., $\phi_0, \phi_1, \ldots, \phi_{n/2-1}$) and corresponding n/2 complementary phase signals (e.g., $\phi_{0B}, \phi_{1B}, \ldots, \phi_{(n/2-1)B}$) in implementations of clock phase recovery circuit 204 that include complementary delay lines in DLL 310, as discussed below.

Delay-locked loop 310 includes a feedback loop including phase detector 320, which may be any suitable phase detector that compares the received clock signal to a delayed version of the received clock signal to generate a phase difference signal. That phase difference is applied to delay line 323. For example, delay line 323 may be a voltage-controlled delay line. The phase difference may be converted by phase-to-voltage circuit 322 into a voltage (e.g., P2V_OUT) that is applied to delay line 323 to adjust the delay of individual delay elements of the delay line to be equivalent and to have a duration that provides a cumulative delay of the delay line equal to the period of the received clock. In at least one embodiment of the invention, the delay line is a current-controlled delay line and the phase difference is converted by an appropriate circuit, accordingly. Phase signals $\phi_0, \phi_1, \ldots, \phi_{n-1}$ are versions of the received clock delayed by equivalent increments from next adjacent phase signals. Those phase signals may be generated by tapping off nodes of the delay line. In an exemplary DLL 310, DLL 310 locks at the 180° point of the received clock signal, which is a half-rate clock signal (e.g., 2.6 GHz at a 5.2 Gbps data rate) to provide a total delay that is equal to one unit interval or bit-time (e.g., 192 ps for a 2.6 GHz received clock signal).

In an exemplary embodiment of clock phase recovery circuit 204, DLL 310 is a delay line that includes two complementary delay lines driven by complementary versions of the received clock signal. The two complementary delay lines are tapped after each inverter of the delay lines to provide phase-adjacent signals separated by only one inverter delay, thereby improving phase resolution by a factor of two of the individual delay lines. In such an exemplary DLL 310, DLL 310 locks at the 180° point of the received clock signal, which is a half-rate clock signal (e.g., 2.6 GHz at a 5.2 Gbps data rate) to provide a delay of the individual ones of the complementary delay lines that is equal to one unit interval or bit-time (e.g., 192.3 ps for a 2.6 GHz received clock signal). Delay-locked loop 310 outputs true taps from delay line 323 (e.g., $\phi_0, \phi_1, \ldots, \phi_5$), which provide the first 180° of phase signals. In addition, DLL 310 outputs complement taps (e.g., $\phi_{0B}, \phi_{1B}, \ldots, \phi_{5B}$), which provide the second 180° of phase signals. The 12 phase signals cover the 360° of phase with 30° of separation between adjacent phases, each phase signal providing a delay of (30°/360°)×(1/2.6 GHz)=32.05 ps.

Since DLL 310 outputs only discrete values and the phase difference between the received clock signal and the received data signal may not be exactly one of these discrete values, phase select and phase interpolator circuit 312 selects (e.g., according to PSEL) two adjacent phase signals that have phases with respect to the received clock signal that are nearest to the phase difference to be applied to the received clock signal for use in generating the sample clock signal. Those two adjacent phase signals (e.g., $\phi_i$ and $\phi_{i+1}$) are received by phase interpolator circuit 326 and a phase interpolation of the two adjacent phase signals may be performed to generate an interpolated clock signal (e.g., PI_OUT) that is used to generate the sample clock signal. Phase interpolator circuit 326 may be any suitable phase interpolation circuit. Phase interpolator designs are well known in the art and are typically dependent upon the particular DLL implementation and electrical parameters of the interface in which they operate.

The phase difference between the received clock signal and the received data signal may not fall exactly between the selected adjacent phase signals and phase interpolator 326 may not apply an equal weight to each of the adjacent phase signals. Rather, phase interpolator 326 may receive control signals (e.g., weighting signals $W_i$ and $W_{i+1}$) generated by control logic 314 that indicate an appropriate weighting function for application to phase signals $\phi_i$ and $\phi_{i+1}$ to generate the signal having an intermediate phase, e.g., PI_OUT. Accordingly, PI_OUT is an interpolated version of $\phi_i$ and $\phi_{i+1}$ having a particular phase relationship with the received data signal and is used to generate the sample clock signal, which may be phase aligned with the center of the data eye of the received data signal.

In at least one embodiment of phase interpolator circuit 326, weighting signals $W_i$ and $W_{i+1}$ are four bits wide, i.e., each of the phase signals $\phi_i$ and $\phi_{i+1}$ may be weighted by sixteen different values. For example, DLL 310 provides only the exemplary discrete values 0°, 30°, 60°, 90°, 120°, . . . , 330° phase shift signals. To obtain a phase shift of 10°, which is between the discrete phase shifts of 0° and 30°, control logic 314 provides a value for $W_i$ that weights $\phi_i$ at ⅔ and a value for $W_{i+1}$ that weights $\phi_{i+1}$ at ⅓ (e.g., 0°×⅔+30°×⅓=10°).

Figure 5:
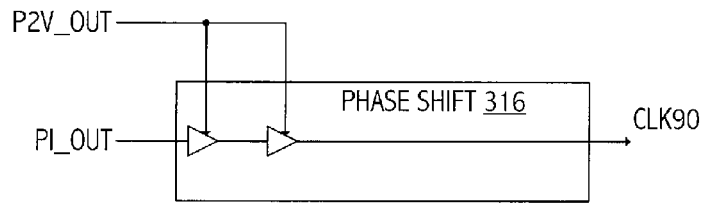
FIG. 5 illustrates a block diagram of an exemplary phase shifting circuit of a clock phase recovery circuit of FIG. 3 consistent with one or more embodiments of the present invention.

Referring back to FIG. 3, the sample clock may be generated by an exclusive-or (e.g., as applied by XOR 318) of the intermediate phase signal (e.g., PI_OUT) with a phase-shifted version of the intermediate phase signal. For example, the intermediate phase signal is a phase-shifted version of the received clock signal and, thus, is a half-rate clock signal (e.g., 2.6 GHz at a 5.2 Gbps data rate). A full-rate clock signal (e.g., 5.2 GHz at a 5.2 Gbps data rate) is generated by exclusive-oring the intermediate phase signal with a version of the intermediate phase signal that is phase shifted by 90°. Referring to FIG. 5, an appropriate phase shift (e.g., a 90° phase shift) is generated by including within exemplary phase shift circuit 316, an appropriate fraction of the number of delay elements in the delay line 323 of DLL 310. The delay elements in phase shift circuit 316 are adjusted by the voltage generated by phase-to-voltage circuit 322 (e.g., P2V_OUT) that is applied to delay line 323 to adjust the delay of individual delay elements of delay line 323 to be equivalent and to have a duration that provides a total delay of the delay line equal to an appropriate period of the received clock signal. In at least one embodiment of the invention, P2V_OUT is applied to phase shift circuit 316 to provide a 90° phase shift.

Referring back to FIG. 3, the signal generated by XOR 318 is the sample clock signal that is used to sample the received data signal. One edge of the sample clock signal (i.e., rising or falling edge) is aligned with transitions in the received data signal. The other edge of the sample clock signal is half a unit interval away from the data edge, which is generally in the center of the data eye and is used to sample the received data signal. Note that since transmit clock jitter is present in both the received data signal and the received clock signal, the transmit clock jitter is effectively a common mode phase variation that is rejected by clock phase recovery circuit 204. Accordingly, the transmit clock jitter can be greater than otherwise allowable (e.g., as compared to clock recovery techniques that do not use a forward clock).

In at least one embodiment of the invention, in a low-power mode, neither clock nor data are transmitted by transmit interface 110 on CLK or a corresponding data line. However, since phase and control information in clock phase recovery circuit 204 may be stored in a digital state, clock phase recovery circuit 204 may recover from the low-power mode by maintaining or restoring the digital state from a previously known digital state. Upon resumption of data transmission, the clock phase recovery will be faster than if DLL 310 achieves lock from an initialization state. In another low-power mode, transmit interface 110 may send a clock signal on CLK, but not send data on an individual one of CTL or CAD[n:0]. Delay-locked loop 310 may continue to operate and adjust the delay of the delay line 323. Upon resumption of data transmission, the clock phase recovery will be faster than if DLL 310 achieves lock from a previous state or from an initialization state.

In at least one embodiment of clock phase recovery circuit 204, control logic circuit 314 implements a technique for moving phase settings independent of the feedback loop in clock phase recovery circuit 204, thereby providing a mechanism to perform time margining at the input of sampling circuit 305. Since control logic circuit 314 stores phase information in a digital state (e.g., in phase counter 338) of FIG. 6, the clock phase recovery circuit 204 may be used to adjust the phase of the sample clock signal to determine timing margin of the received data eye at the inputs of sampling circuit 305. The adjustment of the phase settings independently from the feedback loop of clock phase recovery circuit 204 is referred to herein as "jitter injection." Jitter injection may be used for time margining of clock phase recovery circuit 204 for test purposes, product development, or other suitable purposes.

Figure 7:
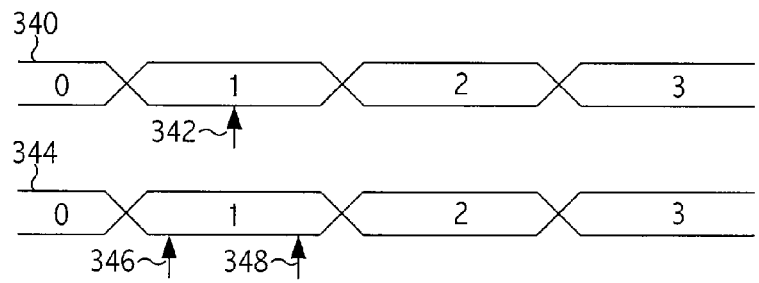
FIG. 7 illustrates exemplary waveforms consistent with one or more embodiments of the present invention.

Referring to FIG. 7, exemplary waveform 340 is sampled at a nominal sample point (e.g., position 342, which is in the center of the received data eye) after clock phase recovery circuit 204 achieves lock. When jitter injection is enabled, control logic circuit 314 moves the sample point to the left or to the right of the nominal sample point (e.g., moves the sample point to position 346 or position 348, respectively). For example, referring back to FIG. 6, after control logic circuit 314 locks clock phase recovery circuit 204 to a nominal sample point, jitter injection circuit 336 adds a phase movement step in a positive or negative direction from the nominal sample point of the sample clock signal. The phase movement introduced by jitter injection circuit 336 is independent of the output of IIR filter 332.

In at least one embodiment of jitter injection circuit 336, a phase movement step of a predetermined value is controlled by a predetermined number of control bits to introduce different sized phase movements from the nominal sample point of the sample clock signal. For example, a phase movement step of two picoseconds associated with eight bits of control provides 128 different phase movements in either direction from the nominal sample point of the sample clock signal. In at least one embodiment of jitter injection circuit 336, a software-accessible control and status register is used to trigger a programmed movement of a phase counter 338 to shift the position of the sample clock signal away from a nominal position (e.g., edge of sample clock in the center of the receive data eye). A sign bit indicates a direction of the shift, e.g., a '0' results in a movement to the left of the nominal position and a '1' results in a movement to the right of the nominal position. The amount of phase movement injected (e.g., in terms of phase interpolator steps) is digitally controlled by multiple bits in the control and status register. For example, a number of bits in the control and status register may be used to control a high phase and a low phase of the jitter injection clock. During the high phase of the jitter injection clock, an individual tick of the sample clock includes a phase movement corresponding to the number of steps and direction indicated in the control and status register. Phase counter circuit 338 generates control signals for phase select and phase interpolation circuit 312, accordingly.

Figure 8:
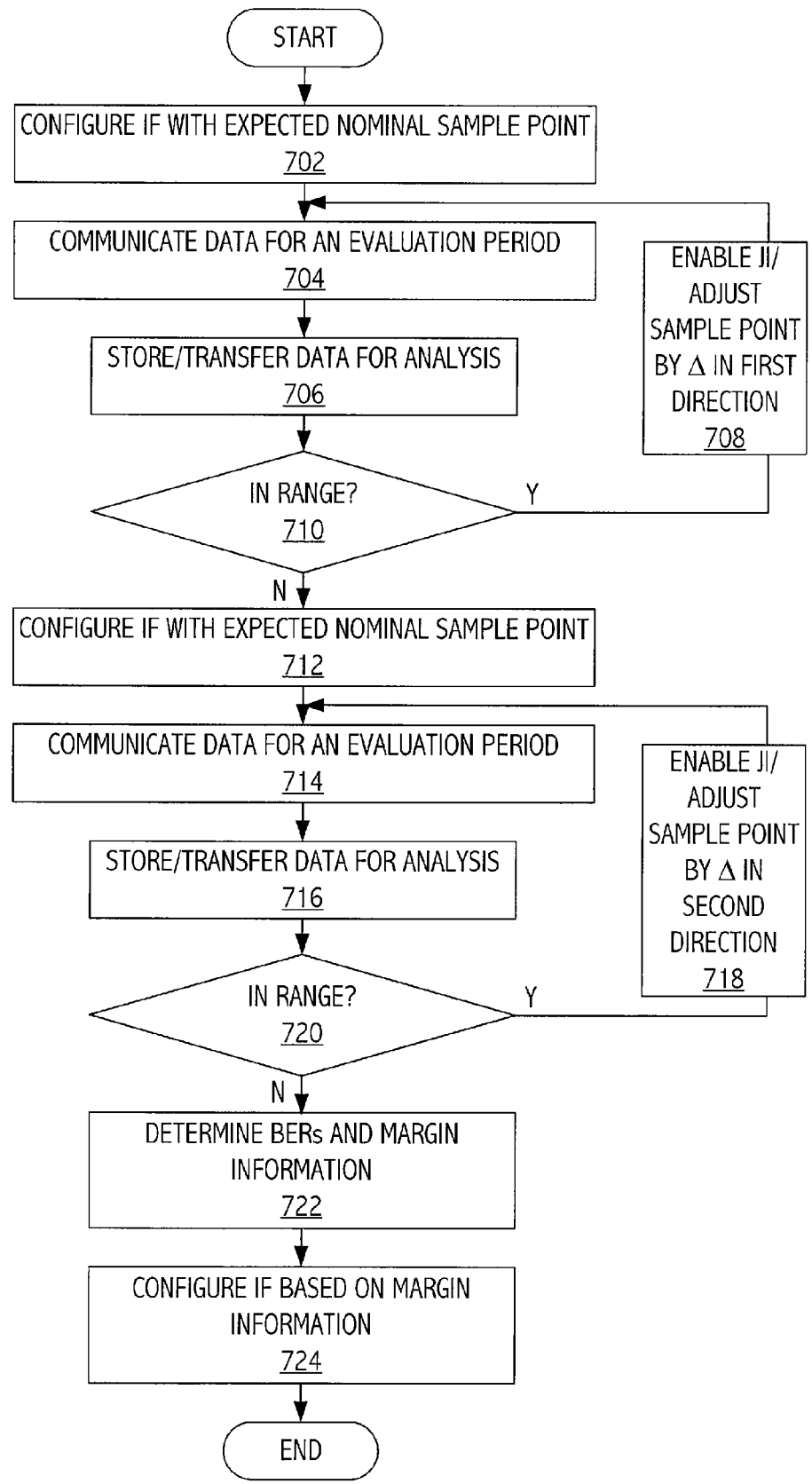
FIG. 8 illustrates exemplary information and control flows consistent with one or more embodiments of the present invention.

Referring to FIG. 8, in at least one embodiment of integrated circuit 102, control logic circuit 314 is configured with jitter injection disabled and communications are established between integrated circuit 102 and 104 over transmit interface 110 and receive interface 114, respectively (702). DLL 310 achieves lock of CAD4_SCLK to the center of the receive data eye and establishes communications between integrated circuit 102 and integrated circuit 104 via transmit interface 110 and receive interface 114, respectively. The sample clock signal samples the received data signal at an expected nominal point, i.e., a point of the received data signal that is expected to be the center of the received data signal during an evaluation period (704). The sampled data is either stored internal to integrated circuit 102 (e.g., in storage circuit 120) or communicated off-chip, e.g., by interface 130, transmit interface 110, or other suitable technique (706). After a suitable number of bit-times, integrated circuit 104 may determine whether a bit-error rate (i.e., BER) based on the sampled data equals or exceeds a threshold BER value. If the BER is within an acceptable range (710), integrated circuit 104 may then enable jitter injection and adjust the sample point by one or more phase interpolator increments in a first direction (708) from the expected nominal sample point. Integrated circuit 104 may continue data communications operations and storage and/or transfer of data for analysis until a maximum jitter is injected or until a bit-error rate (i.e., BER) determined from the sampled data equals or exceeds a threshold BER value (710).

Next, integrated circuit 104 may reconfigure receive interface 114 with jitter injection disabled and communications are established between integrated circuit 102 and 104 over transmit interface 110 and receive interface 114, respectively (712). DLL 310 achieves lock of CAD4_SCLK to the center of the received data eye and establishes data communications between integrated circuit 102 and integrated circuit 104 via transmit interface 110 and receive interface 114, respectively. The sample clock signal samples the received data signal at the expected nominal point (714). The sampled data is either stored internal to integrated circuit 102 or communicated off-chip, (716). Integrated circuit 104 may determine whether a BER determined from the sampled data equals or exceeds a threshold BER value. If the BER is within an acceptable range (720), integrated circuit 104 may then enable jitter injection and adjust the sample point by one or more phase interpolator increments in a second direction (718) from the expected nominal sample point. Integrated circuit 104 may continue data communications and storage and/or transfer of data for analysis until a maximum jitter is injected or until a bit-error rate (i.e., BER) determined from the sampled data equals or exceeds a threshold BER value (720).

After performing jitter injection in both directions from the expected nominal sample point, BERs are determined from the stored/communicated data and analyzed (722). For example, the data are analyzed to determine whether the expected nominal sample point is an actual nominal sample point that samples the received data signal in the center of the bit time. The data may also be used to determine timing margin, i.e., the amount that the sample clock may vary from an actual nominal sample point and maintain a BER below a specified BER. That information may be used to configure the interface of the system and/or a plurality of other systems having the same configuration as the margined system (724). For example, integrated circuits 102 and 104 may be included in a reference system on a printed circuit board and coupled to particular devices by traces on the printed circuit board that substantially fix the channel characteristics between respective ones of transmit interface 110 and receive interface 114. Other systems having the same configuration as the reference system (but on other printed circuit boards) may have substantially the same, substantially fixed, channel characteristics. Thus, control settings determined for transmit interface 110 and receive interface 114 of integrated circuits 102 and 104, respectively, may also be used for the plurality of other systems having the same configuration as the reference system.

Figure 9:
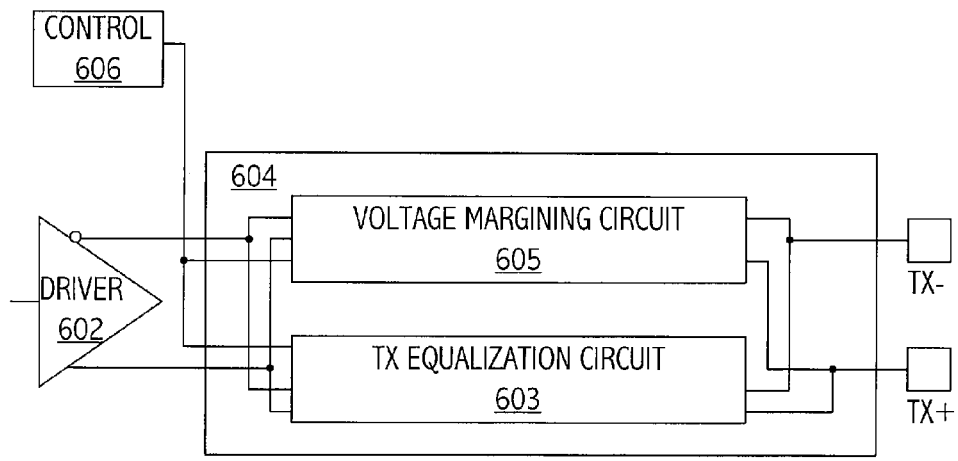
FIG. 9 illustrates a block diagram of an exemplary communications link transmit path on an integrated circuit device consistent with one or more embodiments of the present invention.

Referring to FIG. 9, an exemplary transmit interface includes a driver 602, and a transmit equalization and voltage margining circuit 604. Although illustrated as providing differential signals TX+ and TX−, the invention is not limited to differential embodiments and the teachings herein may be adapted to single-ended embodiments. Note that the transmit interface may include termination circuitry and electrostatic discharge protection circuitry, or other circuitry (not shown). Transmit equalization and voltage margining circuit 604 includes circuitry controllable by control circuit 606 to scale, by a programmable amount, the voltage swing of a signal output by transmit interface 110 of FIG. 1. The output levels are controllable to change over a range of output voltage levels (e.g., decrease monotonically from the full output voltage swing). In at least one embodiment of voltage margining circuit 605, at least sixteen levels of voltage swing span a range including full output voltage swing and 25% of full output voltage swing. However, the number of levels and the range of the levels may vary for different communications links and/or applications.

Referring back to FIG. 9, control circuit 606 configures transmit equalization and voltage margining circuit 604 to vary the output level of a signal transmitted onto a communications path by a programmable amount. The signal is received by receive interface 114 (FIG. 1) from the communications path and sampled by clock phase recovery circuit 204 (FIG. 4). To determine the amount of margin at the sampling device in clock phase recovery circuit 204, control circuit 606 varies the output voltage swing over a range of output voltage swings. The BERs corresponding to respective output voltage swings may be analyzed to determine an amount of voltage margin at the input of sampling circuit 305.

Although transmit voltage margining circuitry and transmit de-emphasis equalization circuitry may be separate circuits in transmit interface 110, in at least one embodiment of the invention, circuitry used for transmit equalization is also used for voltage margining. In at least one embodiment of transmit interface 110, the transmitter equalization circuit implements de-emphasis equalization. The transmit de-emphasis equalization may be pre-cursor (i.e., the amplitude changes in the bit-time before transition of the signal to a new logic value) or post-cursor (i.e., the amplitude changes after transition of the signal to a new logic value) de-emphasis equalization. An exemplary post-cursor transmit de-emphasis equalizer compensates for high-frequency loss characteristics of the channel by using a programmable amount of post-cursor de-emphasis. The differential output level that is transmitted after remaining at the same logic level for more than one bit-time is programmable. For example, an exemplary post-cursor transmit equalization filter may have the following transfer function:

$$H(z) = 1 + b1 \times z^{-1} + b2 \times z^{-2} + b3 \times z^{-3}.$$

The exemplary de-emphasis level for post-cursor transmit de-emphasis equalization may be calculated in dB:

$$DE = 20 \times \log_{10}\left(\frac{V_{TX\text{-}DIFF\text{-}DE}}{V_{TX\text{-}DIFF}}\right).$$

Figure 10:
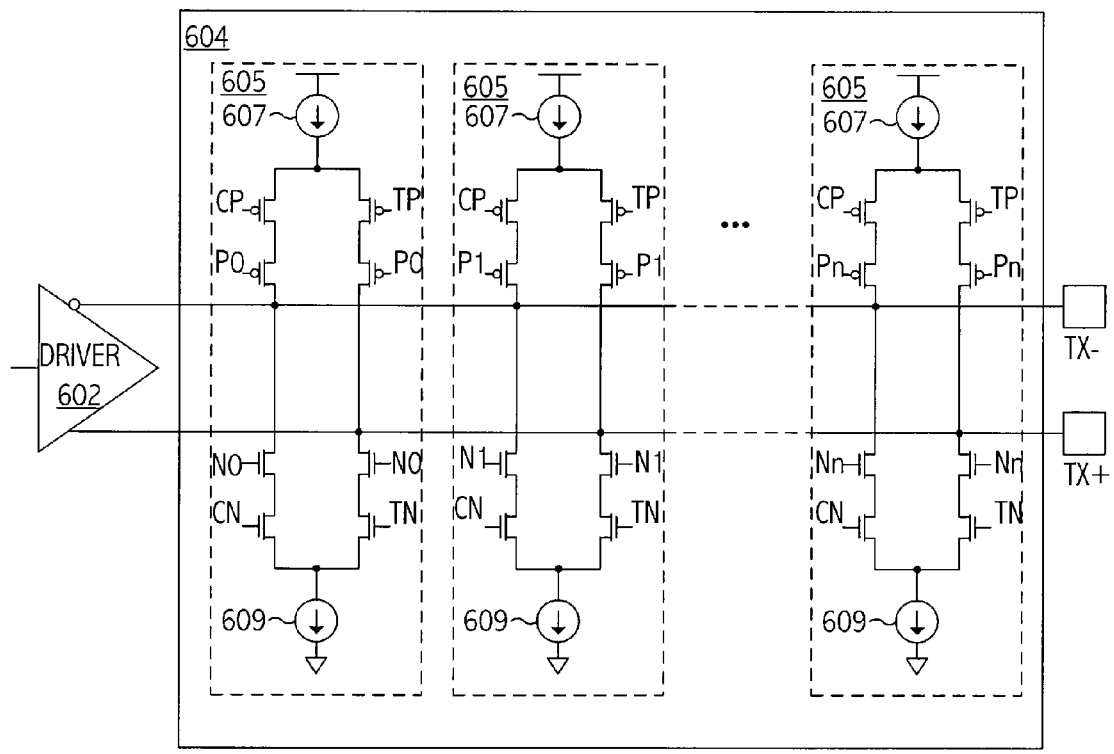
FIG. 10 illustrates a circuit diagram of an exemplary transmit equalization and voltage margining circuit of FIG. 9 consistent with one or more embodiments of the present invention.
Figure 11:
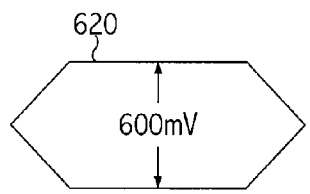
FIG. 11 illustrates exemplary waveforms consistent with one or more embodiments of the present invention.
Figure 11:
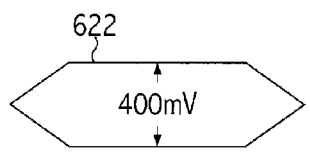

Referring to FIG. 10, in at least one embodiment of transmit interface 110, an exemplary transmit equalization and voltage margining circuit 604 may be configured by control circuit 606 to perform voltage margining of the transmitter output. Transmit equalization and voltage margining circuit 604, can also be configured by control circuit 606 to perform transmit de-emphasis equalization. For example, referring to FIG. 11, a differentially transmitted signal (e.g., waveform 620) may have a full-swing output voltage of 600 mV. However, transmit equalization and voltage margining circuit 604 may attenuate the output voltage swing by 33% to provide a differentially transmitted signal (e.g., waveform 622) having an output voltage swing of 400 mV.

Referring back to FIG. 10, transmit equalization and voltage margining circuit 604 includes $2^n - 1$ (e.g., 31) instantiations of circuit 605, providing n (e.g., five) bits of programmability to the voltage margining (and transmit de-emphasis equalization) function. Although circuits 605 are illustrated as having identical transistor sizes, other embodiments of transmit equalization and voltage margining circuit 604 may binary weight transistor sizes to provide other voltage margining and/or equalization functions. Current sources 607 and current sinks 609 may be generated by precision digital to analog converters. When all current sources/sinks are effectively enabled (i.e., providing full output voltage swing), a total current of approximately 6 mA flows from TX+ through a load (not shown) and back into TX−. Control signal pairs TN and CP and TP and CN are true-complement pairs of signals generated by control circuit 606 to implement the transmit de-emphasis function. For example, TN=history && data and TP=history_B+data. When voltage margining is enabled, the corresponding devices are configured according to the output data for the voltage margining function. For example, TN=data and TP=data_B. When the voltage margining function is enabled, strength control signals P0, P1, ..., Pn, being '0' and, N0, N1, ..., Nn are selectively enabled according to a particular target voltage swing for the output signal. A full-swing output signal corresponds to the control signals P0, P1, ..., Pn, being '0' and, N0, N1, ..., Nn being '1'. However, other combinations of these control signals may provide the same functionality.

Figure 12:
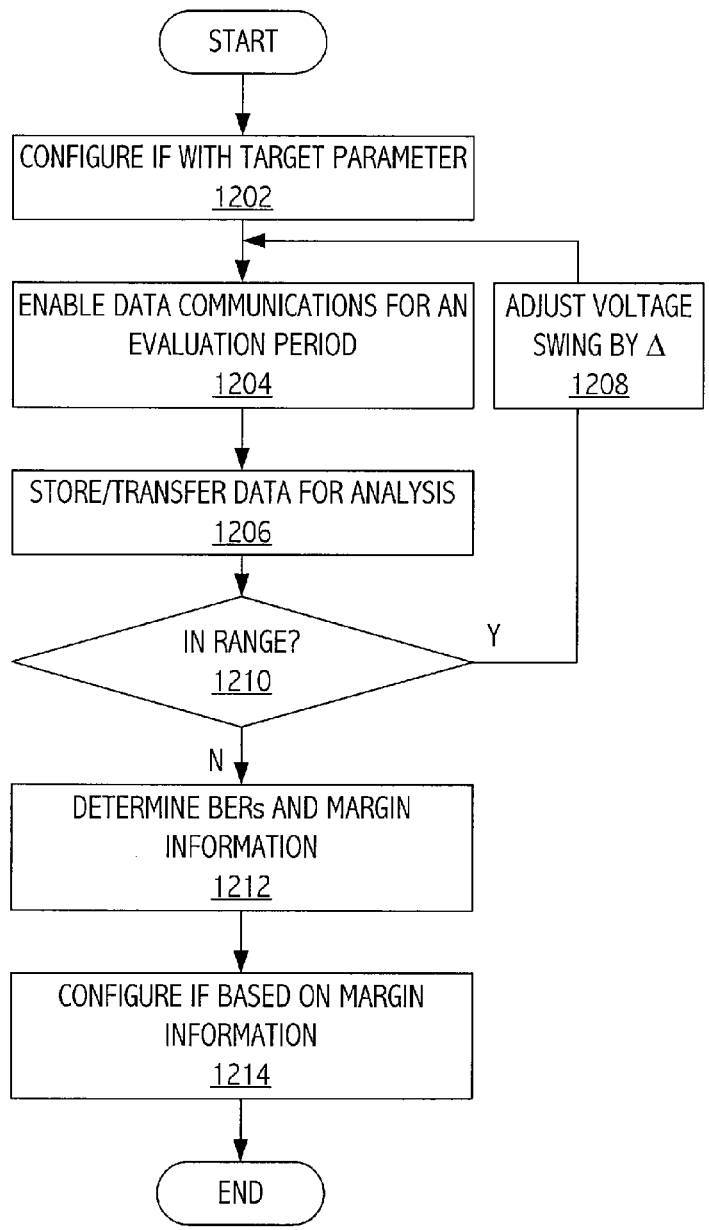
FIG. 12 illustrates exemplary information and control flows consistent with one or more embodiments of the present invention.

Referring to FIG. 12, in at least one embodiment of integrated circuit 102, control circuit 606 configures transmit equalization and voltage margining circuit 604 to generate a full-scale output voltage swing (1202). Communications are established between integrated circuit 102 and 104 over transmit interface 110 and receive interface 114, respectively, and receive interface 114 samples the received data signal during an evaluation period (1204). The sampled data is either stored internal to integrated circuit 102 (e.g., in storage circuit 120) or communicated off-chip, e.g., by interface 130, transmit interface 110, or other suitable technique (1206). After a suitable number of bit-times, integrated circuit 104 may determine whether a bit-error rate (i.e., BER) determined from the sampled data equals or exceeds a threshold BER value. If the BER is within an acceptable range (1210), integrated circuit 102 may then enable voltage margining and adjust the output voltage swing in increments (1208). Integrated circuit 104 may continue data communications and storage and/or transfer of data for analysis until a minimum transmit voltage swing is achieved or until a bit-error rate (i.e., BER) determined from the sampled data equals or exceeds a threshold BER value (1210).

After the output voltage has been varied over the programmable range, BERs determined from the stored/communicated data are analyzed (1212). For example, the data are analyzed to determine a voltage margin, i.e., the amount that the transmit voltage swing may vary from the full-swing voltage and maintain a BER below a specified BER. The information may be used alone or in combination with time margining information, global frequency margining, global timing margining information, or other combinations thereof, as described above, to configure the communications interface. In addition, a plurality of other systems having the same configuration as the communications interface of a reference system may be based on the margin information.

In at least one embodiment of the invention, integrated circuits 102 and 104 may be included in a reference system on a printed circuit board and coupled to particular devices by traces on the printed circuit board that substantially fix the channel characteristics between respective ones of transmit interface 110 and receive interface 114. In at least one embodiment of the invention integrated circuits 102 and 104 are embedded in a single integrated circuit die included in a reference system and coupled by traces on the integrated circuit die that substantially fix the channel characteristics between respective ones of transmit interface 110 and receive interface 114. In addition, although FIG. 1 illustrates a point-to-point communications link (i.e., a communications link with exactly two endpoints and no data or packet formatting), the invention is not limited thereto. In at least one embodiment of the invention, integrated circuit 102 is a master device (e.g., a memory controller) coupled to multiple slave integrated circuits 104 (e.g., slave memory devices).

Figure 13:
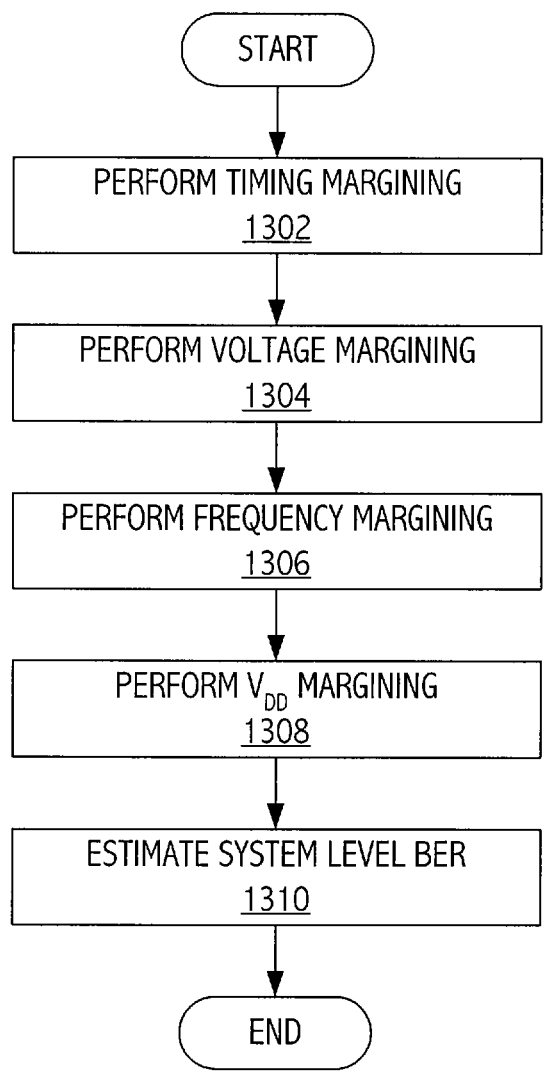
FIG. 13 illustrates exemplary information and control flows consistent with one or more embodiments of the present invention.

If the communications link is configured with one or more parameters (e.g., phase of sample clock or voltage swing levels) causing the communications link to operate near a failure point associated with the one or more of the parameters, adjustment(s) to the one or more parameters (e.g., voltage swing and/or phase of the sample clock) may cause a steep change in the BER. That is, a small adjustment to the one or more parameters may change the BER from a relatively low BER (e.g., one error in every $10^{12}$ bit-times) to a relatively high BER (e.g., at least one error in every $10^6$ bit-times). Thus, in some configurations, coarse information at the failure point provided by timing margining and voltage margining at the sampling device of the receiver interface may be insufficient to generate an accurate BER contour plot. Referring to FIG. 13, a technique for determining a system level bit-error rate (BER) for the communications link of FIG. 1, includes performing global frequency margining (1306) and global voltage margining of the system (1308), in addition to time margining (1302) and voltage margining (1304) at the sampling device in the receive interface. The combination of these data may then be used to generate a BER contour plot, which may be used to estimate a more accurate system level BER than achievable with global voltage and frequency margining or voltage and timing margining at the receiver sampling device alone. Note that the techniques described herein are not limited to a particular order of margining operations 1302, 1304, 1306, and 1308 and the margining operations described herein may be performed in other orders to generate a BER contour plot.

While circuits and physical structures are generally presumed, it is well recognized that in modern semiconductor design and fabrication, physical structures and circuits may be embodied in computer-readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable medium includes at least disk, tape, or other magnetic, optical, semiconductor (e.g., flash memory cards, ROM), or electronic medium.

The description of the invention set forth herein is illustrative, and is not intended to limit the scope of the invention as set forth in the following claims. For example, while the invention has been described in an embodiment in which the voltage swing of the signal communicated between transmit interface 110 and receive interface 114 is adjusted by the transmit interface 110, one of skill in the art will appreciate that the teachings herein can be utilized to modify the voltage swing of that signal at the receive interface 114 prior to the sampling device. In addition, while the invention has been described in an embodiment in which the phase of the sample clock communicated between transmit interface 110 and receive interface 114 is adjusted by receive interface 114, one of skill in the art will appreciate that the teachings herein can be utilized to modify the phase of that signal at transmit interface 110. Techniques described herein may be used to decrease a period of time over which a BER is measured during time margining by using voltage margining techniques and/or to decrease a period of time over which a BER is measured during voltage margining by using time margining techniques. Variations and modifications of the embodiments disclosed herein, may be made based on the description set forth herein, without departing from the scope and spirit of the invention as set forth in the following claims.

What is claimed is:

1. A method for determining margin associated with a receiver circuit of an integrated circuit comprising:
periodically sampling a signal over a time period by the receiver circuit using a sample clock signal to generate a sampled version of the signal;
generating the sample clock signal by the receiver based on a received clock signal and phase change request signals;
incrementally varying phase alignment of the sample clock signal to the signal, the varying of the phase alignment being through a range of values of the phase alignment over the time period by generating the phase change request signals based on a jitter injection signal and a signal indicative of a phase difference between the signal and the received clock signal; and determining a margin value of the receiver circuit associated with the phase alignment based on the sampled version of the signal.

2. The method, as recited in claim 1, wherein the incrementally varying comprises:
   adding a phase modulation offset to the sample clock signal, the phase modulation offset having a frequency above a tracking bandwidth of a data phase tracking circuit of the receiver circuit.

3. The method, as recited in claim 1, wherein the integrated circuit is included in a reference system and the method further comprises:
   determining an operating value of the phase alignment in the reference system based on the margin value determined for the integrated circuit;
   setting, to the operating value, a corresponding parameter in another system,
   wherein the other system includes a second integrated circuit coupled to a third integrated circuit by a fixed communications path.

4. The method, as recited in claim 3, wherein the fixed communications path is at least one of a bus coupling the second and third integrated circuits within an embedded application, a bus on a printed circuit board coupling the second and third integrated circuits on a single printed circuit board, and a bus coupling the second and third integrated circuits on separate printed circuit boards.

5. A method for determining margin associated with a receiver circuit of an integrated circuit comprising:
   periodically sampling a signal over a time period by the receiver circuit to generate a sampled version of the signal;
   incrementally varying a voltage swing associated with the signal, by a transmitter circuit on another integrated circuit coupled to the integrated circuit, the varying of the voltage swing being through a range of values of the voltage swing over the time period; and
   determining a margin value of the receiver circuit associated with the voltage swing based, at least in part, on the sampled version of the signal,
   wherein the voltage swing is varied over a range including at least approximately a maximum voltage swing and approximately 25% of the maximum voltage swing.

6. The method, as recited in claim 1, wherein the phase alignment is varied over a range including at least approximately +/−25% of a unit interval of the sample clock signal.

7. The method, as recited in claim 1,
   wherein the signal and the received clock signal are received from a second integrated circuit on separate communications paths.

8. The method, as recited in claim 1, wherein the determining the margin value comprises:
   comparing samples of the signal to corresponding expected values of the samples of the signal;
   determining a bit-error rate associated with individual values of the phase alignment based, at least in part on the comparison; and
   determining the margin value based, at least in part, on at least one of the individual bit-error rates.

9. The method, as recited in claim 1, further comprising;
   estimating a system bit-error rate based, at least in part, on the margin value of the receiver circuit.

10. An integrated circuit product comprising a second integrated circuit configured based at least in part on the margin value determined by the method recited in claim 1.

11. A receiver circuit of an integrated circuit, the receiver circuit comprising:
   a receiver sampling circuit configured to generate a sampled data signal based on an input signal and a sample clock signal; and
   a control circuit configured to generate phase change request signals based on a jitter injection signal and indicator signals indicating a phase difference between the input signal and a received clock signal, the phase change request signals incrementally varying phase alignment of the sample clock signal to the input signal through a range of values over a time period; and
   a circuit configured to generate the sample clock signal based on the received clock signal and phase change request signals.

12. The receiver circuit, as recited in claim 11, wherein the receiver circuit further comprises:
   a delay-locked loop circuit responsive to the received clock signal to provide a plurality of phase clock signals having respective phases spaced equally across at least a predetermined fraction of the period of the received clock signal;
   a select circuit responsive to at least one phase select signal of the phase change request signals to select from the plurality of phase clock signals, a first phase clock signal having a first phase and a second phase clock signal having a second phase different from the first phase; and
   a phase interpolator circuit responsive to at least one interpolation control signal of the phase change request signals to generate an interpolated clock signal based on the first phase clock signal and the second phase clock signal,
   wherein the control circuit is responsive to the indicator signals to generate the at least one phase select signal and the at least one interpolation control signal.

13. The receiver circuit, as recited in claim 11, wherein the receiver circuit further comprises:
   a phase detector circuit responsive to the input signal and the sample clock signal to generate an indicator of a phase difference between the received clock signal and the input signal.

14. The receiver circuit, as recited in claim 11, further comprising:
   first and second communications paths;
   a second integrated circuit; and
   a printed circuit board,
   wherein the integrated circuit and the second integrated circuit are attached to the printed circuit board and coupled to each other by at least the first and second communications paths.

15. The receiver circuit, as recited in claim 11, further comprising:
   the first and second communications paths;
   an integrated circuit substrate; and
   a second integrated circuit,
   wherein the integrated circuit and the second integrated circuit are formed on the integrated circuit substrate and coupled to each other by at last least the first and second communications paths.

16. The receiver circuit, as recited in claim 11, wherein the integrated circuit further comprises:
   a storage circuit coupled to the receiver circuit to receive data based at least in part on samples of the input of the receiver sampling circuit; and
   an interface circuit coupled to the storage circuit and configured to provide external to the integrated circuit, information based at least in part on the samples of the input of the receiver sampling circuit over the time period.

17. The receiver circuit, as recited in claim 11, wherein the control circuit comprises:
   a circuit configured to apply a delay to shift the phase of the sample clock signal with respect to a phase of a received clock signal based on the phase change request signals.

18. The method, as recited in claim 1, wherein generating the sample clock signal comprises applying a delay to shift the phase of the sample clock signal with respect to a phase of the received clock signal based on the phase change request signals.

\* \* \* \* \*

UNITED STATES PATENT AND TRADEMARK OFFICE
CERTIFICATE OF CORRECTION

| | | |
|---|---|---|
| PATENT NO. | : 8,570,881 B2 | Page 1 of 1 |
| APPLICATION NO. | : 11/668010 | |
| DATED | : October 29, 2013 | |
| INVENTOR(S) | : Gerald R. Talbot et al. | |

It is certified that error appears in the above-identified patent and that said Letters Patent is hereby corrected as shown below:

In the Claims:

In column 14, line 58, please delete "last".

Signed and Sealed this
Eleventh Day of February, 2014

Michelle K. Lee
*Deputy Director of the United States Patent and Trademark Office*